United States Patent [19]

Eng, Jr. et al.

[11] Patent Number: 5,321,403
[45] Date of Patent: Jun. 14, 1994

[54] MULTIPLE SLOPE ANALOG-TO-DIGITAL CONVERTER

[75] Inventors: Benjamin Eng, Jr.; Don P. Matson, both of Everett, Wash.

[73] Assignee: John Fluke Mfg. Co., Inc., Everett, Wash.

[21] Appl. No.: 48,537

[22] Filed: Apr. 14, 1993

[51] Int. Cl.$^5$ ............... H03M 1/50; H03M 1/10
[52] U.S. Cl. ................................ 341/168; 341/120
[58] Field of Search ............ 341/168, 166, 167, 120, 341/118

[56] References Cited

U.S. PATENT DOCUMENTS

| | | |
|---|---|---|
| 4,354,176 | 10/1982 | Aihara . |
| 4,357,600 | 11/1982 | Ressmeyer et al. . |
| 4,559,521 | 12/1985 | Yada . |
| 4,574,271 | 3/1986 | Yada . |
| 5,101,206 | 3/1992 | Riedel . |
| 5,117,227 | 5/1992 | Goeke . |

*Primary Examiner*—Sharon D. Logan
*Attorney, Agent, or Firm*—George T. Noe

[57] ABSTRACT

A multiple slope integrating analog-to-digital converter (ADC) includes many improvements and refinements which eliminate timing and non-linearity errors which accumulate due to a large number of switching operations that occur over an integrate cycle. The ADC includes an integrator and a comparator in which an input voltage to be measured is applied to a summing node at the input of the integrator during an integrate cycle, while at the same time positive and negative reference currents are selectively applied to the summing node by a controller which monitors the output of the comparator in order to limit the voltage magnitude at the output of the integrator. Thereafter, during a de-integrate cycle, the input voltage is disconnected while progressively shallower ramps are measured with a high-speed clock for greater resolution and accuracy. The comparator has a slight hysteresis built in to slightly separate the switching thresholds for positive-going and negative going ramps.

The switches which control selection of the positive and negative reference currents are implemented in such a way that current surges are minimized. A method is provided to control the order in which the switches are operated to eliminate the effects of charge injection due to operation of the switches as well as signals that are cross-coupled from the control lines of adjacent switches.

The length of time the respective positive and negative currents are turned on during the integrate cycle is measured, and adjustments may be made using predetermined calibration factors to resolve errors in the ADC system. Thus, circuit parameters and values need only to be stable and not be precise, permitting the use of readily-available and inexpensive off-the-shelf parts and components.

9 Claims, 8 Drawing Sheets

MULTIPLE SLOPE ANALOG-TO-DIGITAL CONVERTER

BACKGROUND OF THE INVENTION

This invention relates generally to analog-to-digital converters, and in particular to a multiple-slope integrating analog-to-digital converter having improved accuracy and resolution.

Conventional dual-slope integrating analog-to-digital converters (ADCs) are well known to those skilled in the art, and operate by placing a charge on a capacitor associated with an operational amplifier integrator proportional to an unknown voltage to be measured (charging the capacitor for a predetermined period of time, resulting in the first slope of the dual-slope system), applying a reference voltage to discharge the integrator capacitor at a known rate (resulting in the second slope) and measuring the amount of time for discharge, and finally calculating the unknown voltage as a ratio of the measured time and the predetermined time multiplied by the reference voltage.

Because of the long time periods and perhaps relatively high voltage headroom required to charge and discharge in the integrator capacitor in high resolution ADC systems, multiple slope integrating ADCs were devised which periodically remove or add known quantities of charge (represented by slopes of known polarity and duration) during the integrate, or charge cycle (also known as the run-up cycle) so that an unknown input voltage is never large enough to saturate the integrator, and a relatively small charge remains on the integrating capacitor to be discharged during the de-integrate, or discharge cycle (also known as the run-down cycle). The charge removed or added during the integrate cycle is kept track of by counting slopes which represent the known quantities of charge removed or added, and accounted for in making the final determination of the value of the unknown voltage. The multiple slope techniques may also be applied during the de-integrate or run-down cycle to shorten the amount of time required to discharge the integrator capacitor, resulting an ADC with increased sensitivity and speed. An example of a multiple slope integrating ADC is taught in U.S. Pat. No. 4,357,600 to Ressemeyer et al.

Many of the problems associated with prior art multiple slope integrating ADCs stem from the large number of high-speed switching operations that occur in a short period of time, particularly during the integrate cycle. For example, mismatches in the physical characteristics of the switches themselves, however slight, will result in timing errors that will add up over the course of two thousand switching operations. Mismatches in reference currents, rectification of cross coupling of switch control signals which pumps extraneous current into the integrator summing node, and switch charge injection which also delivers unwanted current into the integrator summing node all result in non-linear errors, offset, and scale factor errors which cumulatively degrade measurement accuracy. These errors are very critical in analog-to-digital converters with 5½ or 6½ digits of resolution. The errors are significantly worse when standard components such as off-the-shelf analog switches are used for the input switching circuits. Prior art investigators have attempted to overcome these problems by implementing the input switching circuits in application-specific integrated circuit form and tightly controlling the manufacturing process, leading to very expensive solutions.

Another problem associated with prior art multiple slope integrating ADCs is what is known as the "toning" effect, or fixed pattern that occurs with the integrator after many, many switching operations in which the switching sequence is always the same. As an example, for input voltages near zero volts, a small change in input voltage may result in a larger than expected change in the measured output due to a change in the pattern. This error is referred to as differential non-linearity.

SUMMARY OF THE INVENTION

In accordance with the present invention, an improved multiple slope analog-to-digital converter overcomes the foregoing problems and provides increased accuracy and resolution.

The multiple slope ADC comprises an integrator followed by slope amplifier and a comparator in which an input voltage to be measured is applied to a summing node at the input of the integrator during an integrate cycle, while at the same time positive and negative reference currents are selectively applied to the summing node by a controller which monitors the output of the comparator in order to limit the voltage magnitude at the output of the integrator and to determine the order and sequence in which the positive and negative currents are applied. Thereafter, during a de-integrate cycle, the input voltage is disconnected while progressively shallower ramps are measured with a high-speed clock for greater resolution and accuracy.

The slope amplifier expands the ramp around the comparator switching threshold to increase the switching sensitivity of the comparator. Diode clamps prevent overdriving the comparator input, facilitating quick recovery of the comparator, whose output is monitored by the controller. Also, the comparator has a slight hysteresis built in to slightly separate the switching thresholds for positive-going and negative going ramps, reducing the tendency of the comparator to chatter or oscillate when very shallow ramps are applied from the slope amplifier.

The switches which control selection of the positive and negative reference currents are implemented in such a way that current surges are minimized. That is, each switch is a series-parallel pair of switches in which the series switch of the pair provides a path to the integrator summing node while the parallel switch of the pair provides a path to ground, and one of the switches in the switch pair is closed while the other of the pair is closed. State machine diagrams are used to express the algorithms used by the controller in operating the switches throughout the integrate and de-integrate cycles. The order and sequence in which the switches are operated eliminates the effects of charge injection due to operation of the switches as well as signals that are cross-coupled from the control lines of adjacent switches. The controller maintains in storage a history of the switching sequence and present comparator output, and from that information determines which reference (or both references) to apply or not apply to the integrator summing node.

Counters are provided separately to keep track of the length of time the respective positive and negative currents are turned on during the integrate cycle, and adjustments may be made using predetermined calibration factors to correct reference current mismatch, offset, and gain errors in the ADC system. Thus, circuit parameters and values need not be precise as long as they are stable, permitting the use of readily-available and inexpensive off-the-shelf parts and components.

It is therefore one feature of the present invention to provide an improved multiple slope analog-to-digital converter having increased accuracy and resolution.

It is another feature of the present invention to provide an improved multiple slope analog-to-digital converter in which the effects of cross-coupled switch charge injection are eliminated.

It is a further feature of the present invention to provide an improved multiple slope analog-to-digital converter which can be calibrated to resolve errors, thus obviating the need for precise operating parameters and components.

Other objects, features, and advantages of the present invention will become obvious to those having ordinary skill in the art upon a reading of the following description when taken in conjunction with the accompanying drawings.

DETAILED DESCRIPTION OF THE INVENTION

Figure 1:
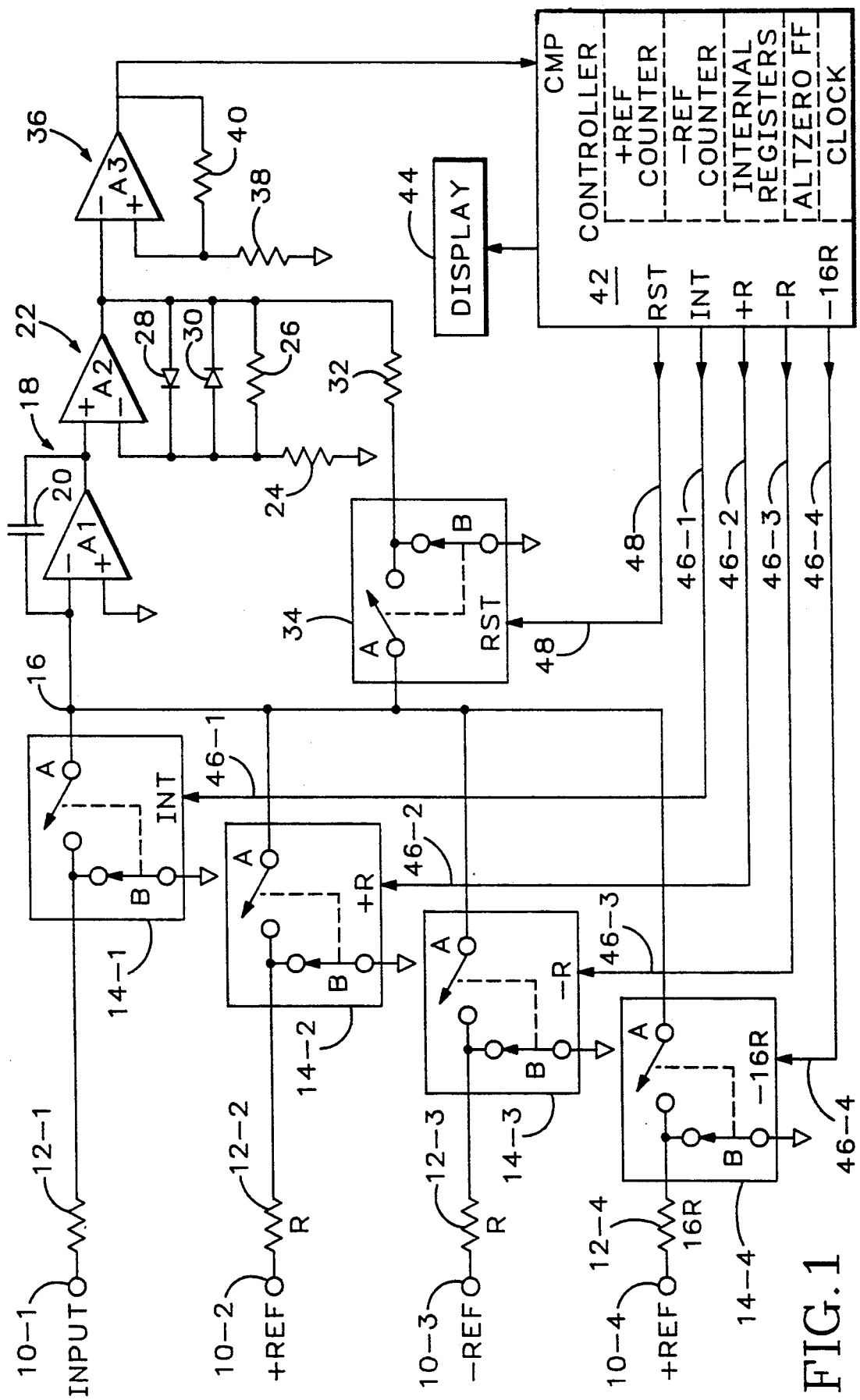
FIG. 1 is a schematic diagram of a multiple slope integrating analog-to-digital converter in accordance with the present invention.

Referring to FIG. 1 of the drawings, there is shown a multiple slope integrating analog-to-digital converter in which a voltage input to be measured is applied to an INPUT terminal 10-1, and then through a resistor 12-1 and closed contact A (shown open) of a switch 14-1 to a summing node 16. Other inputs to the summing node 16 include stable reference voltages +REF and −REF, which are nominally equal and of opposite polarity, applied via nominally equal-valued resistors 12-2 and 12-3 and switches 14-2 and 14-3, respectively, and reference voltage +REF applied via resistor 12-4 and switch 14-4, and will be discussed in detail later.

An integrator 18 comprising an operational amplifier (op amp) A1 having an inverting (−) input connected to summing node 16 and a non-inverting (+) input connected to a common potential such as ground, and a feedback capacitor 20 connected from its output to its input, produces output voltage ramps whose slopes are proportional to and of opposite polarity to input voltages applied to summing node 16.

A slope amplifier 22 comprising an op amp A2 having a+ input connected to the output of integrator 18 and a− input connected to the junction of gain-setting resistors 24 and 26, which are serially disposed between the output of op amp A2 and ground, amplifies the ramp voltage from integrator 18 (provides a steeper slope of the same polarity) to expand the ramp when it passes through zero volts and thereby increase the sensitivity of the comparator in the next stage. A pair of diodes 28 and 30 are connected in opposite directions across resistor 26 to provide a voltage window of +0.6 volt and −0.6 volt to limit the output swing of the slope amplifier. The output of slope amplifier 22 is also connected through a resistor 32 and contact B of a switch 34 to ground during normal measurement operation, and upon reset (RST), through resistor 32 and contact A of switch 34 to the summing node 16 to zero the output prior to a measurement cycle.

A comparator 36 comprising an op amp A3 having a− input connected to the output of slope amplifier 22 and a+ input connected through a resistor 38 to ground switches states and produces a digital output whenever the output ramp from the slope amplifier 22 passes through a threshold near zero volts at the comparator input. A resistor 40 is connected from the + input to the output of op amp A3 to provide positive feedback to establish a few millivolts of hysteresis, separating the thresholds at which the positive-going ramps and negative-going ramps cause the comparator to switch, thereby preventing oscillation of the comparator due to indecision when very shallow ramps are applied to the− input. Resistor 38 in an embodiment built and tested had a value of 10 ohms, while resistor 40 had a value of 3 kilohms. The digital output of comparator 36, because the input (integrator output) is applied to the− input, is low, or CMP=0 if the input is positive with respect to ground, and high, or CMP=1 if the input is negative with respect to ground. Thus, the comparator 36 output goes low, or CMP=0 for positive-going ramps that pass through a first threshold near zero volts and goes high, or CMP=1 for negative-going ramps which pass through a second threshold near zero volts. Of course, zero volts at the comparator input is the switching threshold if resistors 38 and 40 are omitted and the+ input is connected to ground. Also, the logic would be inverted if the integrator output were applied to the+ input of the comparator.

A controller 42 controls operation of the multiple slope ADC by controlling the operation of switches 14-1 through 14-4 through a measurement cycle comprising an integrate cycle and subsequent de-integrate cycle and calculating the voltage reading to be displayed on a display device 44. Controller 42 may suitably be a microprocessor, or may be an application-specific logic which performs as a state machine in accordance with either an external or an internal clock, depending on the type of controller, and programmed operating instructions which, in addition to providing instructions for determining and displaying voltage measurements, define a switching sequence algorithm for controlling the operation of the switches.

The switches 14-1 through 14-2 and 34 may suitably be implemented in integrated circuit form, or may be commercially available analog switches, such as common 74HC4053 silicon-gate CMOS analog switches, in which the series and parallel switch contacts A and B, respectively, depicted in FIG. 1, connected by dashed lines, are actually transistor devices wherein one transistor is on while the other is off, that is, one switch of an A-B pair is closed while the other is open. The switches are operated by control signals applied over control lines 46-1 through 46-4 and 48, respectively, from controller 42. All of the switches in FIG. 1 are shown with their respective B contacts closed, and their respective A contacts open, so that, as shown, no current flows into summing node 16. Taking a closer look at any of the switches, for example, switch 14-2, it can be discerned that closed contact B is connected to ground, so that, in the example of switch 14-2, a constant current flows through input resistor 12-2. When a control signal arrives on line 46-2 from controller 42, contact A of switch 14-2 snaps closed while contact B snaps open (actually, the transistor represented by contact A turns on while the transistor represented by contact B turns off), and now the current that was flowing to ground is diverted into summing node 16, resulting in no change in current flow through resistor 12-2. Moreover, the stable reference voltage supply +REF will not experience any change in load or output current flow, and will thus remain stable. To further reduce error introduced by the switches themselves, the number of switches required to provide full multiple slope integration has been kept to a minimum.

Also, a critical source of error in the ADC is switch charge injection. There are generally two types of charge injection. One is charge injection resulting from the switch's own control signal, and the other is charge injection resulting the from the control of an adjacent switch. The control signals sent over lines 46-1 through 46-4 and 48 from controller 42 to operate the switches are coupled via intrinsic capacitances in the switches as they are being controlled and cross-coupled to adjacent switches, and introduce charge injection current into the summing node as the positive and negative edges of the control signals are differentiated. The switching action of the controlled switches rectifies the differentiated control signals, resulting in a net positive or negative charge being injected into the summing node, depending on the switching sequence.

Error introduced by the first type of switch charge injection is eliminated by operating the switches a constant number of times over a fixed integration time interval T, independent of an input voltage to be measured, for all input levels, both positive and negative, as is well known by those skilled in the art. The other type of charge injection due to cross-coupling of control signals to adjacent switches is more insidious because it occurs while one reference voltage is already on, and another reference voltage is turned on, and the differentiated edges get conducted to ground or to the summing node differently depending on the phase relationship of the reference-switch control signals. The switching scheme of the present invention solves this problem by choosing the sequence in which the switches are operated, making errors caused by charge injection a constant that can be removed like an offset.

Figure 2:
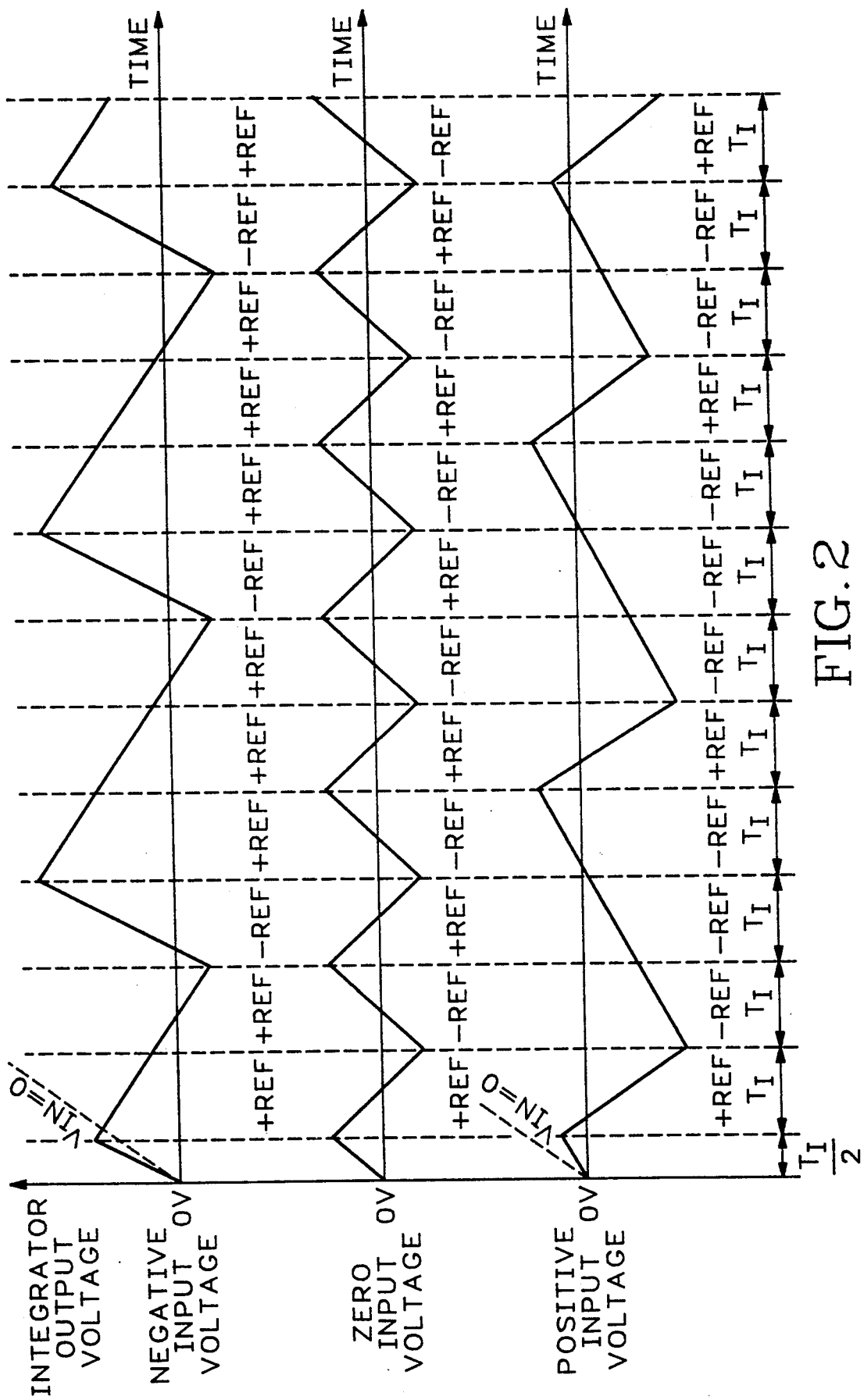
FIG. 2 is a set of waveforms of the integrator output voltage for negative, zero, and positive voltage inputs during a partial integrate cycle.

Before discussing the sequence of switching in accordance with the present invention, it is important to understand the basic operation of the multiple slope integrating ADC during an integrate cycle. FIG. 2 shows the output of integrator 18 in response to an applied negative, zero, and positive input voltages for a partial integrate cycle. An integrate cycle is one in which contact A of switch 14-1 remains closed for a fixed time period to allow an input voltage applied to input terminal 10-1 to place a charge on integrator capacitor 20, and switches 14-2 and 14-3 are operated a fixed number of times to connect negative and positive reference voltages −REF and +REF, depending on the output of comparator 36, to the integrator input for fixed periods of time $T_I$, resulting in addition or subtraction of charge on integrator capacitor 20 as exemplified by positive and negative ramps, respectively, at the output of integrator 18 to minimize the magnitude of voltage applied to amplifier 22. It can be seen in FIG. 2 that the negative reference voltage −REF is applied for the first one-half cycle to ensure that the integrator output voltage is positive with respect to ground in order for the multiple slope integrator to work. Also, if the integrator output voltage crosses the zero-volts baseline during a time period $T_I$, on the next time period the ramp reverses direction. On the other hand, if the integrator output voltage does not cross the zero-volts baseline during a time period $T_I$, on the next time period the ramp continues in the same direction.

Because the reference voltages and summing currents generated through resistors 12-2 and 12-3 may not be precise, the system may be calibrated so that a mismatch of summing currents will not result in an error in the measurement reading provided by the ADC system. This may easily be achieved by having separate counters within or associated with controller 42 that separately count the total length of time that the positive and negative references are turned on during an integrate cycle. In the embodiment built and tested, calibration was effected in the following manner. First, a zero input voltage is applied for one full integration cycle with both reference voltages turned off, and then any charge on the integrator is de-integrated to determine integrator offset due to drift, leakages, noise, etc. Second, both references are turned on with the input disconnected for one full integration cycle, and then any charge on the integrator is de-integrated to determine any imbalance in reference currents. This imbalance, minus integrator offset, is proportional to the ratio of +REF/−REF. Third, the ADC is operated with zero volts applied for a normal integrate cycle as shown in FIG. 2, and any charge on the integrator is de-integrated to determine integrator offset due to switch charge injection. Fourth, the ADC is operated with a known stable reference voltage applied to the input for normal integrate and de-integrate cycles, and any difference between the measurement reading and the reference voltage, minus offset, is proportional to ADC gain. The offsets, gain, and +REF/−REF ratios are stored in memory as calibration constants which can be recalled to calibrate the ADC "on the fly" for each measurement.

Figure 3:
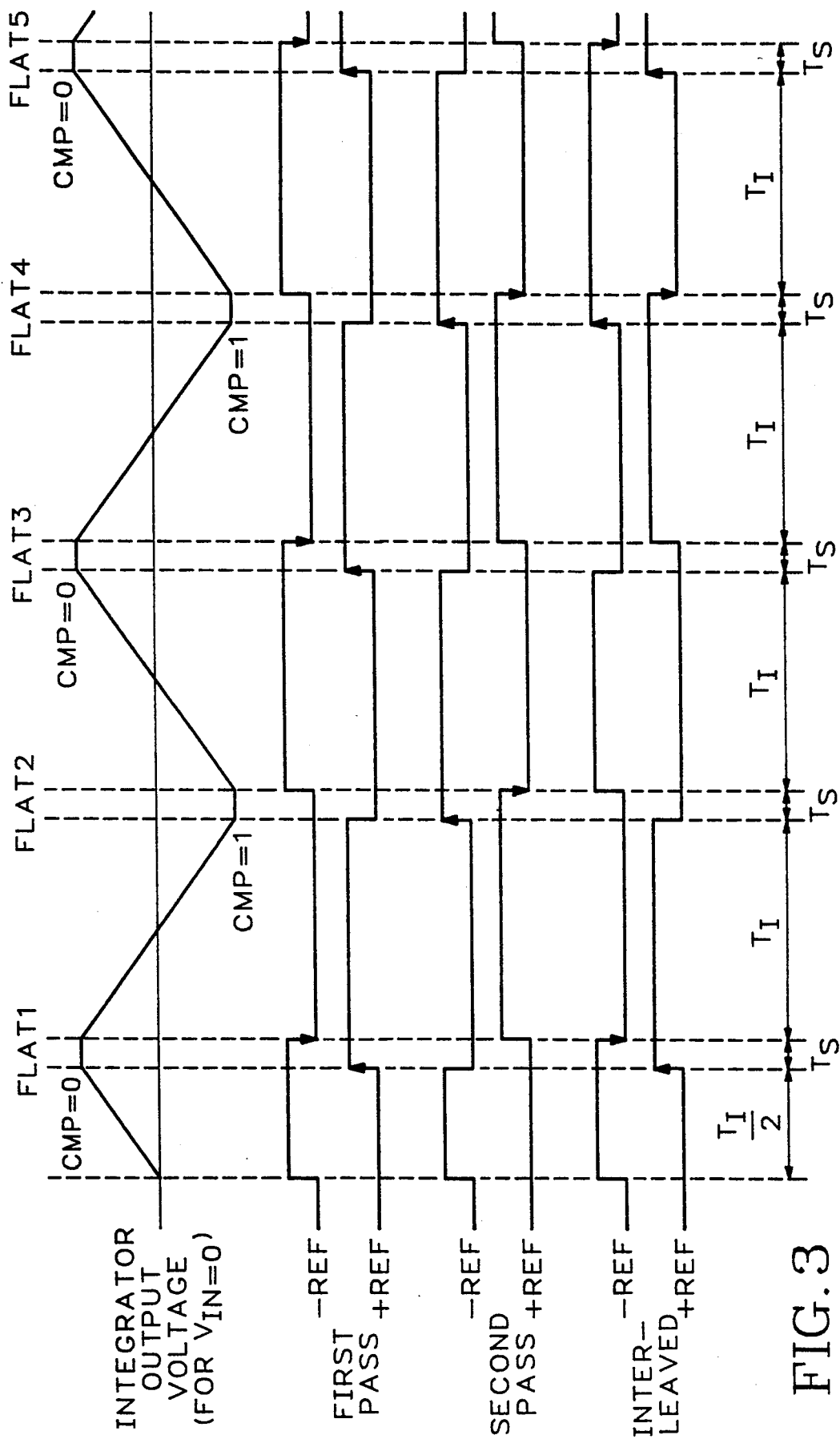
FIG. 3 is a set of waveforms of the integrator output voltage in response to switching reference voltages during an integrate cycle for two-pass and interleaved operation.

Referring now to FIG. 3, wherein for simplicity the applied input voltage is zero volts, it can be seen that between alternate connection of the −REF and +REF voltages, there will be short periods of time $T_s$ when the −REF and +REF voltages are either both connected to the summing node 16 or both disconnected from the summing node 16. Both of these conditions will result in approximately zero current into the summing node 16 (as mentioned earlier, the reference voltages are nominally equal and of opposite polarity, and resistors 12-2 and 12-3 have nominally equal values), and hence, "flat spots" on the integrator 18 output waveform. It is during the flat spots, or simply "flats," that controller 42 looks at the output of comparator 36 to determine the status of the ADC and decide which reference voltage to apply to the summing node 16. That is, if the comparator output is a digital one (CMP=1), −REF is applied to drive the integrator output in a positive-going direction, and if the comparator output is a digital zero (CMP=0), +REF is applied to drive the integrator output in a negative-going direction.

Some desired conditions to be observed during the integrate cycle are (1) the total number of transitions of switches 14-2 and 14-3 must be constant; (2) each switch operates a constant number of times; and (3) switches 14-2 and 14-3 are operated to minimize the voltage magnitude at the output of integrator 18. During the de-integrate cycle, switch 14-1 contact A is opened, and switches 14-2, 14-3 and 14-4 are operated in such a way as to effect a de-integration or removal and measurement of the remaining charge on the integrator capacitor 20.

A complete measurement cycle may comprise a "two pass" integrate and de-integrate cycle, that is, two back-to-back integrate and de-integrate cycles in which the switching of resistors 14-2 and 14-3 during the integrate cycles on the two respective passes is controlled to cancel or at least minimize the effects of cross-coupled charge injection into the summing node 16. The cross-coupled charge injection is depicted in FIG. 3 as arrowheads on the switching transitions of the +REF and −REF voltages. Also, the two-pass integrate cycle is depicted as a "first pass" and "second pass" wherein on the first pass, at flat 1 both −REF and +REF are turned on (ON); at flat 2, both are off (OFF); at flat 3, both are ON; at flat 4, both are OFF; and at flat 5, both are ON. On the second pass, the order is reversed (at flat 1; both are OFF, etc.) to eliminate the effects of cross-coupled charge injection.

Alternatively, a complete measure cycle may comprise single integrate and de-integrate cycles wherein during the integrate cycle the two passes are interleaved to substantially cancel the effects of cross-coupled charge injection. This is shown in FIG. 3 as a single "interleaved" pass wherein, for a zero volts input, at flat 1 both −REF and +REF are ON; at flat 2, both are OFF; at flat 3, both are OFF; at flat 4, both are ON; and at flat 5, both are ON. It can be discerned that at flat 6 both would be OFF as depicted at flat 2, and the order progresses on through the integrate cycle. It must be borne in mind, however, that this particular sequence may vary, depending upon the input voltage, or depending on the algorithm that controls the order of switching. The order in which both references are on or off may be different than those described herein, as long as at the end of a measurement cycle, both references will have sequenced an approximately equal and constant number of times for a constant integrate cycle and the direction of switch transitions will be approximately equal. It will be helpful to review the waveforms in FIGS. 4A and 4B to fully appreciate this concept. It is important that the number of times that +REF transitions ON while −REF is ON remains nearly constant for all inputs, and the number of time that −REF transitions ON with +REF ON also remains nearly constant for all inputs. Also, the number of −REF OFF transitions, while +REF is ON, is approximately equal to the number −REF ON transitions, while +REF is ON. Likewise, the number of +REF ON transitions while −REF is ON is approximately equal to the number +REF OFF transitions while −REF is ON.

Figure 5A:
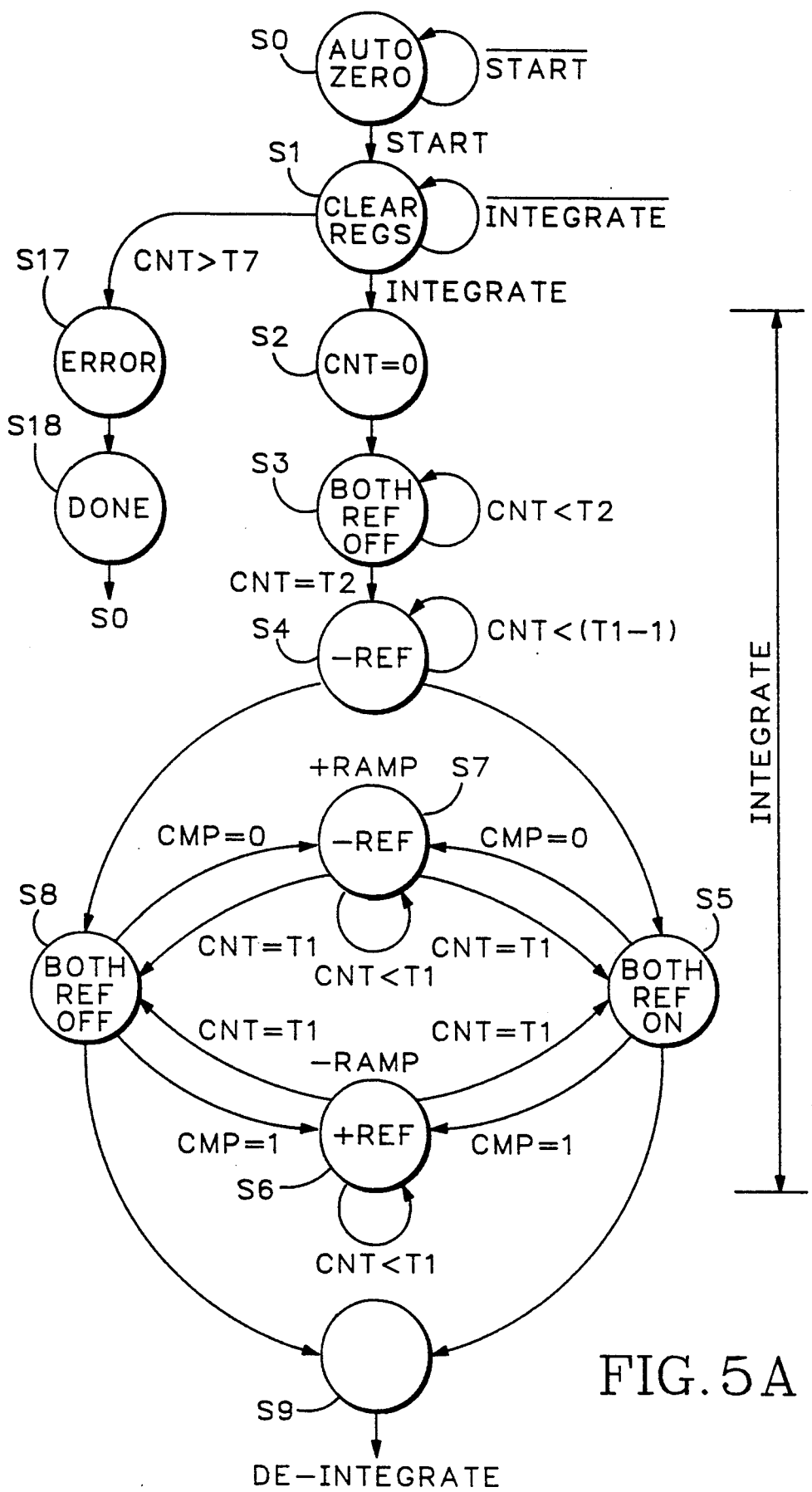
FIGS. 5A and 5B are state machine diagrams for integrate and de-integrate cycles, respectively.
Figure 5B:
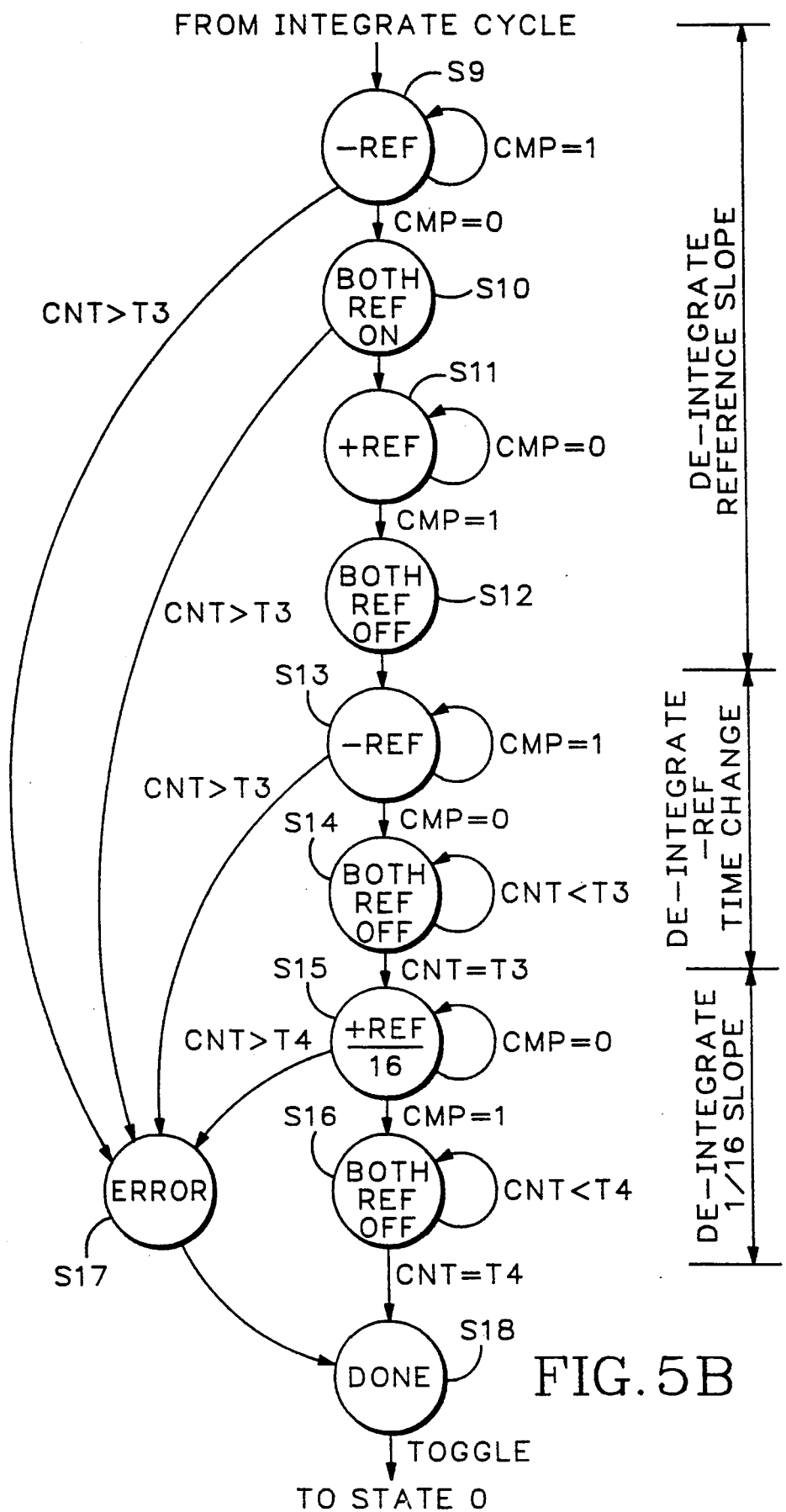
Figure 6A:
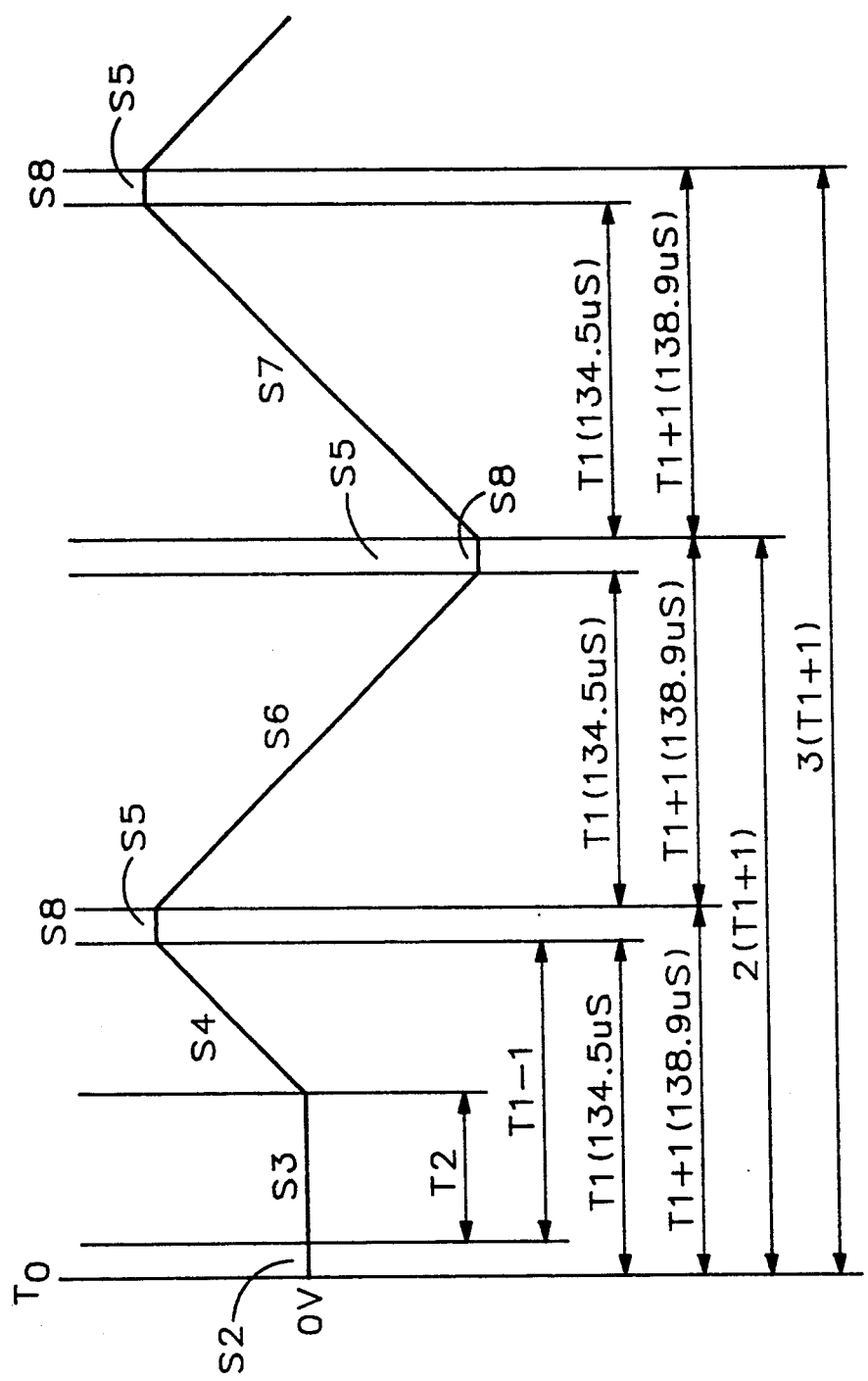
FIGS. 6A and 6B are waveform diagrams of the integrator output voltage during the integrate cycle in association with the state machine operation of FIGS. 5A and 5B, respectively.
Figure 6B:
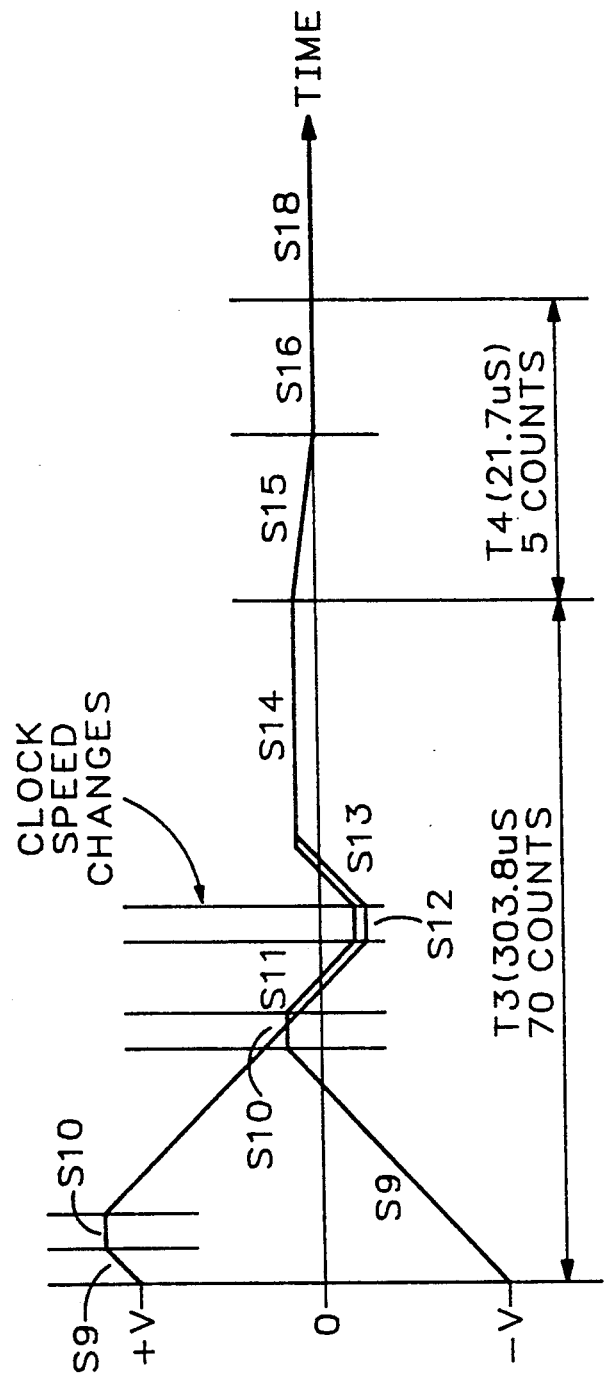

The operation of the multiple slope integrating ADC of FIG. 1 will be described in connection with a state machine diagram as shown in FIGS. 5A and 5B. The portion of the state machine diagram shown in FIG. 5A defines an operating algorithm associated with the programmed instructions of controller 42 for the integration portion of the measurement cycle, and the portion of the state machine diagram shown in FIG. 5B defines an operating algorithm associated with the programmed instructions of controller 42 for the de-integration portion of the measurement cycle. The state machine is driven by an internal clock of controller 42 in a conventional manner. The waveforms in FIGS. 6A and 6B, in which the states are indicated for the integrate and de-integrate cycles, respectively, should also be referred to so that a complete understanding of the operating algorithm can be attained in conjunction with circuit operation. FIG. 6A represents the operation of the circuit of FIG. 1 during an integrate cycle for a zero-volts input at input terminal 10-1.

Also, in order for the integrate period to help reject power line noise, it must be an exact multiple of 16.666 milliseconds for 60 Hz operation, or 20.000 milliseconds for 50 Hz operation. In an embodiment built and tested, the integrate cycle was 100.000 milliseconds to effect noise rejection for both 50 Hz and 60 Hz operation. The clock frequency of controller 42 was chosen to be 230.4 kHz (clock period=4.3403 microseconds). This value for clock frequency will be used for the state machine clock in the following description to aid in understanding operation. Some component values used in the tested embodiment were 0.012 microfarads for integrator capacitor 20, 80 kilohms for input resistor 12-1, 40 kilohms for both reference voltage resistors 12-2 and 12-3, and 640 kilohms for the 16R resistor 12-4.

INTEGRATE CYCLE

State 0: At state 0 (S0), which is the idle state for the state machine of controller 42, an auto zero or reset function of the ADC is performed to ensure that the output of integrator 18 is at zero volts before a measurement is started. Controller 42 performs the auto zero function by sending a reset (RST) signal over line 48 to switch 34, closing contact A and opening contact B so that capacitor 20 has a discharge path through the summing node 16, contact A of switch 34, and resistor 32 to the output of slope amplifier 22, whose output is held near ground. As long as no command to start a measurement is received, controller 42 will continue to idle at state S0, holding switch 34 contact A in its closed position to perform the auto zero or reset function.

State 1: Upon receipt of a start command signal from an external source, such as a pushbutton switch or a control circuit, the state machine of controller 42 sequences on the next clock pulse to state 1 (S1) to clear all internal registers associated with controller 42 to prepare for a new voltage measurement. If controller 42 fails to access an INTEGRATE command within a predetermined number of clock cycles, the program aborts the measurement attempt by jumping to error state 17 (S17) and thence to state 18 (S18) and back to state 0 (S0) to await a new command.

State 2: The state machine sequences to state 2 (S2) when the controller 42 starts an INTEGRATE timer. On the next clock pulse, corresponding with time $T_0$ in FIG. 5A, a control signal from controller 42 over line 46-1 causes switch 14-1 contact B to open and contact A to close, causing current through resistor 12-1 to flow into summing node 16 as an input voltage to be measured is applied to input terminal 10-1. At the same time, a control signal from controller 42 over line 48 causes switch 34 contact A to open and contact B to close, connecting ground to the end of resistor 32.

State 3: The state machine sequences to state 3 (S3) on the next clock cycle, and remains in state 3 for a predetermined time interval T2, which in embodiment tested was equal to 15 clock cycles, or 65.1 µS, during which time the only input to integrator 18 via summing node 16 is through resistor 12-1 from the input voltage applied to input terminal 10-1. Thus, the output of integrator 18 during time interval T2, plus one clock cycle for state 2, is a horizontal line for a zero volt input as shown in FIG. 5A (the integrator output is a negative-going ramp for a positive input voltage or a positive-going ramp for a negative input voltage).

State 4: At the end of time interval T2 in state 3, the state machine sequences to state 4 (S4). Controller 42 immediately sends a control signal over line 46-3 to open contact B of switch 14-3 while closing contact A, connecting negative reference voltage −REF to the summing node 16. The constant current through resistor 12-3 is summed algebraically with the current through resistor 12-1, producing a positive-going ramp voltage at the output of integrator 18. The slope of the ramp is a function of the current at the summing node 16, and hence, into capacitor 20.

After switch 14-3 is operated to connect voltage −REF to summing node 16, controller 42 checks its internal registers and counters to establish whether the state machine sequences to state 5 (S5) or state 8 (S8) to control the operating sequence of switching reference voltages −REF and +REF throughout the integrate cycle. Separate counters are provided to count the total length of time each of the reference voltages −REF and +REF are turned on, as discussed earlier for calibration purposes. For a two-pass integrate and de-integrate measurement cycle, a flip-flop toggles at the end of the first pass (see state 18) so that if the first pass began with both reference voltages −REF and +REF on as defined by state 5, the second pass will begin with a zero reference input (both references off) defined by state 8. This is shown in FIG. 3.

State 5: When the state machine sequences to state 5 (S5), both reference voltages +REF and −REF are ON, connected via switches 14-2 and 14-3, respectively to the summing node 16, so that the net reference current into summing node 16 is nominally zero, resulting in a flat on the waveform as discussed earlier in connection with FIG. 3. Also, for two-pass measurement cycle operation, an ALTZERO flip-flop within controller 42 is toggled so that the state machine will alternate between states 5 and 8 on successive flats. That is, the state machine will sequence to state 8 on the next flat. For interleaved operation, controller 42 keeps a historical record of previous flats and the present comparator output, and from that information determines the next flat. See FIGS. 4A and 4B. Controller 42 looks at the output of comparator 36, if CMP=1, the state machine sequences to state 6 on the next clock cycle, and if CMP=0, the state machine sequences to state 7. When the end of the integrate cycle is reached as determined by the INTEGRATE timer, controller 42 causes the state machine to sequence to state 9 to begin the de-integrate cycle.

State 6: When the state machine sequences to state 6 (S6), only the positive reference voltage +REF is connected to summing node 16, so that the output of integrator 18 is a negative-going ramp voltage. This can be seen in FIG. 3. As the ramp voltage progresses, a counter counts state machine clock pulses over a time interval T1 (in the embodiment built and tested, interval T1 is determined by 31 clock pulses, or 134.5 µS). At the end of interval T1, the state machine sequences to either state 5 or state 8, determined by the status of the ALTZERO flip-flop for a two-pass measurement cycle, or other controller 42 registers for an interleaved measurement cycle.

State 7: When the state machine sequences to state 6 (S6), only the negative reference voltage −REF is connected to summing node 16, so that the output of integrator 18 is a positive-going ramp voltage. This can be seen in FIG. 3. As the ramp voltage progresses, a counter counts state machine clock pulses over a time interval T1 (in the embodiment built and tested, interval T1 is determined by 31 clock pulses, or 134.5 µS). At the end of interval T1, the state machine sequences to either state 5 or state 8, determined by the status of the ALTZERO flip-flop for a two-pass measurement cycle, or other controller 42 registers for an interleaved measurement cycle.

State 8: When the state machine sequences to state 8 (S8), both reference voltages +REF and −REF are OFF, disconnected via switches 14-2 and 14-3, respectively from the summing node 16, so that the net reference current into summing node 16 is zero, resulting in a flat on the waveform as discussed earlier in connection with FIG. 3. Also, for two-pass measurement cycle operation, an ALTZERO flip-flop within controller 42 is toggled so that the state machine will alternate between states 5 and 8 on successive flats. That is, the state machine will sequence to state 5 on the next flat. For interleaved operation, controller 42 keeps a historical record of previous flats and the present comparator output, and from that information determines the next flat. See FIGS. 4A and 4B. Controller 42 looks at the output of comparator 36, if CMP=1, the state machine sequences to state 6 on the next clock cycle, and if CMP=0, the state machine sequences to state 7. When the end of the integrate cycle is reached, controller 42 causes the state machine to sequence to state 9 to begin the de-integrate cycle.

As mentioned earlier, the system does not have to be precise since slight errors may be eliminated by use of calibration factors or constants which may be determined by operating the system with a precise zero volts input applied and monitoring the output of the integrator to locate errors as they appear or accumulate, and then entering calibration factors to resolve the errors. Once calibration constants have been determined for a system, and the system calibrated, the system should thereafter provide error-free operation. By being able to calibrate the system, the voltages, currents, resistances, and timing do not have to be exact or precise, permitting the use of readily-available and inexpensive parts and components.

DE-INTEGRATE CYCLE

State 9: When the integrate cycle is complete, as determined by the INTEGRATE timer, the state machine will sequence from either state 5 or state 8 to state 9 (S9) to begin the de-integrate cycle. Refer to the de-integrate waveform shown in FIG. 6B. At the end of the integrate cycle, the residual charge on capacitor 20 may be either a positive voltage +V or a negative voltage −V. To ensure that the charge on capacitor 20 for the final measurement is positive, the negative reference voltage −REF is connected via switch 14-3 and resistor 12-3 to produce a positive-going ramp at the output of integrator 18. On each clock cycle driving the state machine, the output of comparator 36 is checked. As long as CMP=1, indicating that the output of integrator 18 is negative with respect to ground, voltage −REF will remain connected. As soon as CMP=0 is detected (which may be after one clock cycle if the integrator output is already positive with respect to ground), indicating the output of integrator is positive with respect to ground, the state machine will sequence to state 10. Of course, if CMP=0 is not detected within a predetermined time T3 (which in the embodiment built and tested is 70 counts, or 303.8 µS), indicating a malfunction or an error, the state machine will sequence to state 17 and then to state 18.

State 10: When the state machine sequences to state 10 (S10) upon detection of CMP=0 in state 9, the positive reference voltage +REF is connected via switch 14-2 and resistor 12-2 to the summing node 16 so that both −REF and +REF are ON for one clock cycle, resulting in a flat portion of known duration (one state machine clock cycle) on the de-integrate waveform shown in FIG. 6B.

State 11: When the state machine sequences to state 11 (S11) after one clock cycle in state 10, the negative reference voltage −REF is turned off by disconnecting switch 14-3, leaving the +REF ON (connected through switch 14-2 and resistor 12-2). This causes a negative-going ramp at the output of integrator 18. On each clock cycle driving the state machine, the output of comparator 36 is checked. As long as CMP=0, indicating that the output of integrator 18 is positive with respect to ground, voltage +REF will remain connected. On the clock cycle following detection of CMP=1, indicating the output of integrator is negative with respect to ground, the state machine will sequence to state 12. Notice that the negative-going ramp will continue slightly negative, below the horizontal line representing ground in FIG. 6B. As in state 10, if CMP=1 is not detected within a predetermined time T3, indicating a malfunction or an error, the state machine will sequence to state 17 and then to state 18.

State 12: When the state machine sequences to state 12 (S12) upon detection of CMP=1 in state 11, the positive reference voltage +REF is disconnected from the summing node 16, so that both +REF and −REF are OFF, resulting in a flat portion of known duration (one state machine clock cycle) on the de-integrate waveform shown in FIG. 6B before sequencing to state 13. Also, before sequencing to state 15, the state machine clock frequency is increased by a factor, such as 32, to provide a de-integrate clock having a frequency of 7.3728 MHz, which means that the period of the de-integrate clock is decreased by the same factor, providing higher resolution of the measurement.

State 13: When the state machine sequences to state 13 (S13), the negative reference voltage −REF is applied via resistor 12-3 and switch 14-3 to summing node 16 to produce a positive-going ramp at the output of integrator 18. As long as the comparator 36 output is negative (CMP=1) the ramp continues in a positive-going direction; however, as soon as a zero crossing is detected (CMP=0), the ramp will terminate after one de-integrate clock cycle and the state machine will sequence to state 14. Notice in FIG. 6B that the waveform is slightly positive at the end of state 13. Here again, if the ramp continues positive-going for longer than a pre-set period of time T3, indicating a malfunction or an error, the state machine will sequence to state 17 and then to state 18.

State 14: When the state machine sequences to state 14 (S14), the negative reference voltage −REF is disconnected from the summing node 16, so that nothing is connected to summing node 16 and the output of integrator 18 remains fixed until the end of predetermined period of time T3 as measured from the start of the de-integrate cycle, after which the state machine sequences to state 15.

State 15: When the state machine sequences to state 15 (S15) to de-integrate the remaining charge on integrator capacitor 20 with the de-integrate clock and a less steep slope. Controller 42 sends a control signal over line 46-4 to switch 14-4 to close contact A while opening contact B, connecting positive reference voltage +REF to summing node 16 via resistor 12-4, which has a value 16 times greater than resistors 12-2 and 12-3. Accordingly, the current into summing node 16 is one-sixteenth that provided earlier through resistors 12-2 and 12-3 so that slope of the negative-going ramp at the output of integrator 18 is one-sixteenth as steep as the slopes discussed earlier. As long as the output of comparator 36 is low (CMP=0), indicating that the integrator 18 output is positive with respect to ground, the state machine will remain in state 15. The comparator output is monitored on each cycle of the de-integrate clock, and when CMP=1 is detected, indicating that the output of integrator 18 has reached zero volts and the comparator has switched, the state machine sequences to state 16. Of course, if CMP=1 is not detected within a pre-set period of time T4 (which in the embodiment tested is equal to five state machine clock cycles, or 21.7 µS), indicating a malfunction or an error, the state machine will sequence to state 17 and then to state 18.

State 16: When the state machine sequences to state 16 (S16), controller 42 sends a control signal over line 46-4 to switch 14-4 to open contact A while closing contact B, disconnecting positive reference voltage +REF from summing node 16 so that nothing is connected to summing node 16 and the output of integrator 18 remains fixed until the end of the predetermined period of time T4, after which the state machine sequences to state 18. During state 16, controller 42 determines the value of the input voltage being measured by the ADC by totalling the counts in the +REF and −REF counters to determine the number of times each was ON, indicating approximately the amount of charge added or removed during the integrate cycle, adjusting by predetermined calibration factors such as offset, gain and +REF/−REF discussed earlier and algebraically adding to that the final charge measured during the de-integrate cycle.

State 17: State 17 (S17) is the error state. If the state machine sequences to state 17, controller 42 is notified that an error has occurred somewhere in the measurement cycle, and so an error message may be provided to a display, or controller 42 may reset all of the ADC circuits and internal registers to begin a new measurement cycle.

State 18: When the state machine sequences to state 18 (S18), controller 42 knows either that the measurement cycles has been completed or that an error has occurred. Also, an internal register is toggled so that on a next measurement cycle, or "pass," the state machine at state 4 will know to sequence to either state 5 or state 8. On the next clock cycle, the state machine sequences to state 0.

Figure 4A:
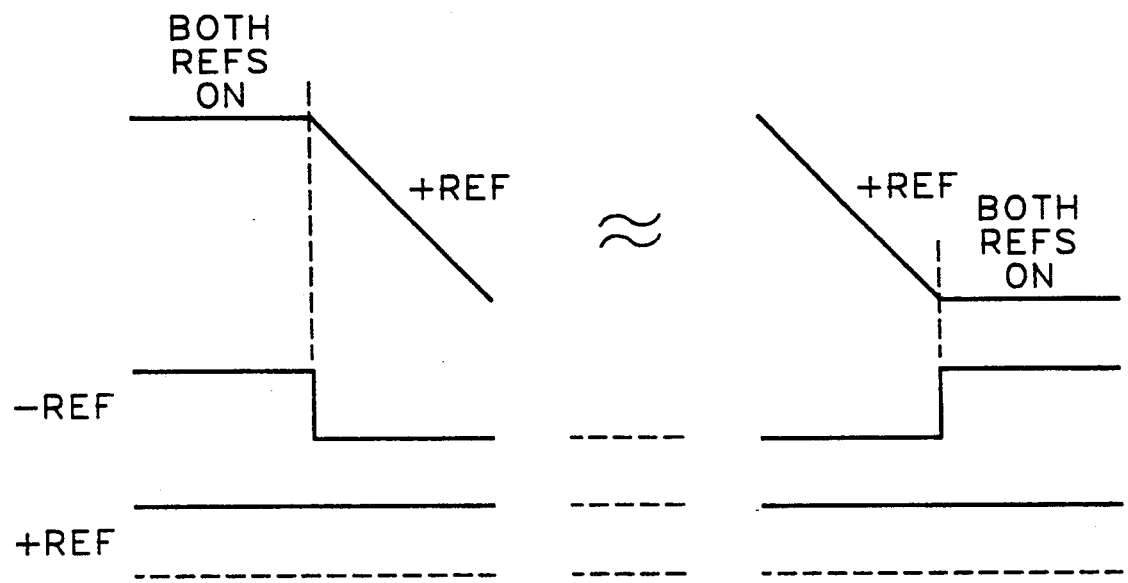
FIGS. 4A and 4B are waveforms to explain one aspect of the present invention.
Figure 4B:
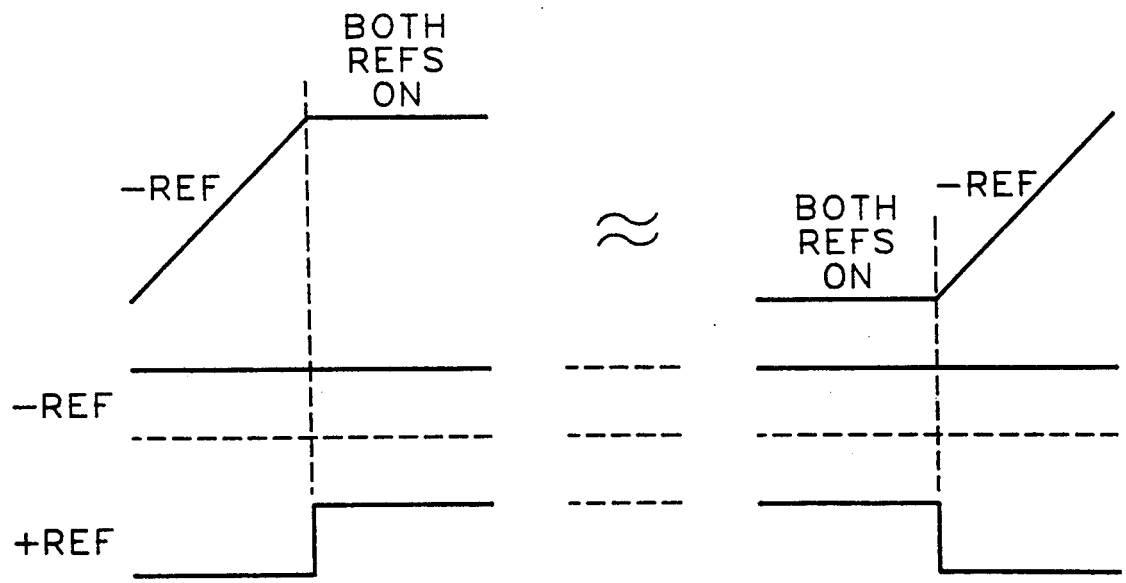

It can be appreciated that component values and clock frequencies other than used for explanatory purposes herein may easily be implemented by one having ordinary skill in the art. Also, the order in which both references are on or off may be different than those described herein, as discussed earlier, as long as the general rule discussed in connection with FIGS. 4A and 4B is observed.

While we have shown and described the preferred embodiment of our invention, it will be apparent to those skilled in the art that many changes and modifications may be made without departing from our invention in its broader aspects. It is therefore contemplated that the appended claims will cover all such changes and modifications as fall within the true scope of the invention.

What we claim as our invention is:

1. A multiple-slope analog-to-digital converter of the type having an operational amplifier integrator having a capacitive element coupled from an input summing node to an integrator output, and a comparator coupled to the integrator output, comprising:
    first switch means coupled to an input terminal for connecting and disconnecting a voltage input to and from said summing node;
    second switch means coupled to a first reference voltage for connecting and disconnecting said first reference voltage to and from said summing node;
    third switch means coupled to a second reference voltage for connecting and disconnecting said second reference voltage to and from said summing node, said second reference voltage being substantially equal to said first reference voltage and of opposite polarity;
    control means coupled to an output of said comparator for monitoring comparator states and storing switching sequence history during an integrate cycle, said control means further for operating said first switch means to connect said input voltage to said summing node for a fixed time interval to provide said integrate cycle while during said integrate cycle operating said second and third switch means to connect and disconnect said first and second reference voltages to and from said summing node in a sequence determined by said control means in response to an output state of said comparator and stored switching sequence history to provide an integrator output while substantially eliminating the effects of cross-coupled switch charge current injection into said summing node.

2. A multiple-slope analog-to-digital converter in accordance with claim 1 wherein said first, second, and third switch means each comprise a series switch for providing a circuit path to said summing node when closed and a parallel switch for providing a circuit path to ground when closed, said series switch being closed when said parallel switch is open, and said series switch being open when said parallel switch is closed.

3. A multiple-slope analog-to-digital converter in accordance with claim 1 wherein said control means operates said second and third switch means in a first phase relationship sequence for a first integrate cycle and a second phase relationship sequence for a second integrate cycle.

4. A multiple-slope analog-to-digital converter in accordance with claim 1 wherein said control means operates said second and third switch means in an interleaved first phase relationship and second phase relationship sequence for a said integrate cycle.

5. A multiple-slope analog-to-digital converter in accordance with claim 1 further comprising means for determining respective total times said first and second reference voltages are connected to said summing node during said integrate cycle.

6. A multiple-slope analog-to-digital converter in accordance with claim 5 wherein said means for determining respective total times said first and second reference voltages are connected to said summing node during said integrate cycle comprise first and second counters.

7. A multiple-slope analog-to-digital converter in accordance with claim 1 further comprising a memory containing stored calibration constants accessible by said controller for providing a calibrated measurement reading.

8. A multiple-slope analog-to-digital converter in accordance with claim 7 wherein said calibration constants represent factors caused by mismatches of operating parameters in said analog-to-digital converter.

9. A multiple-slope analog-to-digital converter in accordance with claim 1 further comprising fourth switch means coupled to a third reference voltage for connecting and disconnecting said third reference voltage to and from said summing node, wherein said control means operates said fourth switch during a de-integrate cycle.

* * * * *